(12) United States Patent
Millard et al.

(10) Patent No.: US 7,473,924 B2
(45) Date of Patent: Jan. 6, 2009

(54) ELECTROLUMINESCENT DEVICE WITH A BLOCKING LAYER AND A DUMMY ELECTRODE REGION

(75) Inventors: Ian Millard, Penang (MY); Hooi Bin Lim, Penang (MY)

(73) Assignee: Osram Opto Semiconductors GmbH, Regensburg (DE)

( * ) Notice: Subject to any disclaimer, the term of this patent is extended or adjusted under 35 U.S.C. 154(b) by 172 days.

(21) Appl. No.: 11/400,754

(22) Filed: Apr. 6, 2006

(65) Prior Publication Data

US 2006/0226422 A1  Oct. 12, 2006

Related U.S. Application Data

(60) Provisional application No. 60/669,185, filed on Apr. 6, 2005.

(51) Int. Cl.
  *H01L 27/28* (2006.01)

(52) U.S. Cl. .......................................... 257/40; 313/505
(58) Field of Classification Search .................. 257/40; 313/504, 505
  See application file for complete search history.

(56) References Cited

U.S. PATENT DOCUMENTS

| | | | |
|---|---|---|---|
| 2002/0060518 A1* | 5/2002 | Duineveld et al. ........... | 313/506 |
| 2003/0052869 A1* | 3/2003 | Fujii et al. .................. | 345/204 |

* cited by examiner

*Primary Examiner*—Thomas L Dickey
(74) *Attorney, Agent, or Firm*—Fish & Richardson P.C.

(57) ABSTRACT

Disclosed is an organic electroluminescent display, comprising a first active electrode region and a first dummy electrode region, the first dummy electrode region electrically isolated from the first active electrode region. Further disclosed is an organic electroluminescent display, comprising a first active electrode region, a first dummy electrode region, and a blocking layer extending on said dummy electrode region preventing light emission.

27 Claims, 6 Drawing Sheets

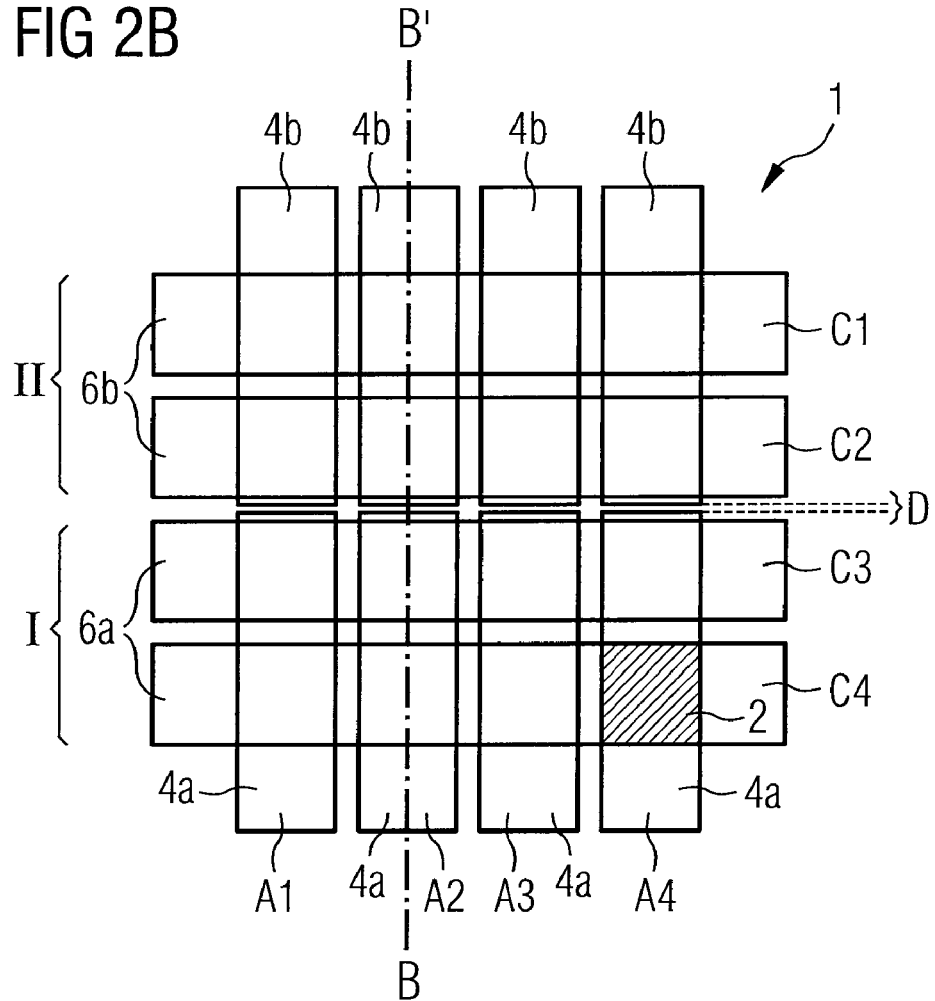
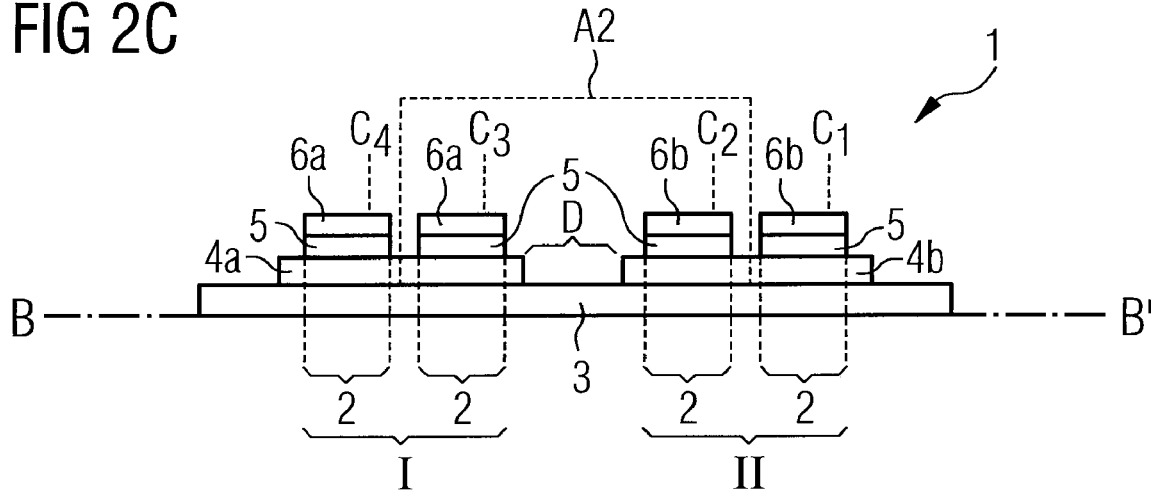

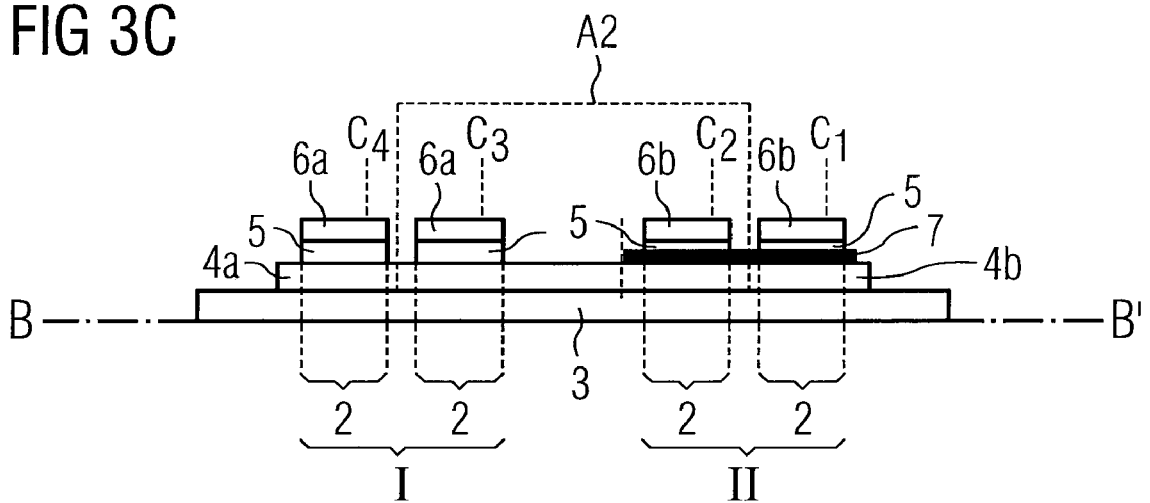
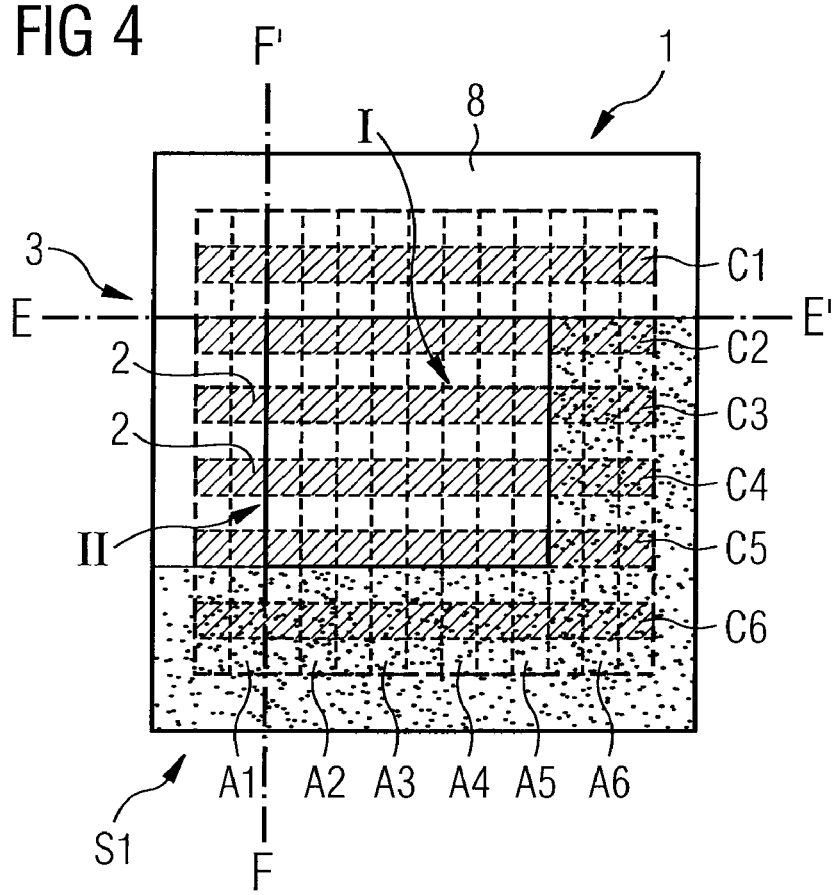

ELECTROLUMINESCENT DEVICE WITH A BLOCKING LAYER AND A DUMMY ELECTRODE REGION

This patent application claims the priority of U.S. provisional application No. 60/669,185, filed on Apr. 6, 2005, the disclosure content of which is hereby incorporated by reference.

BACKGROUND

Field of the Invention

This invention relates generally to the art of thin film device processing and fabrication. More specifically, the invention relates to the structure of Organic Light Emitting Diode (OLED) devices and displays. Examples of OLED devices are OLED light sources used for general purpose lighting. Examples of OLED displays are alphanumeric displays. The displays can be designed as passive matrix displays or active matrix displays.

A display and a device can have areas that are luminescent and areas that are non-luminescent. This can be due to the material coating problems existing with solution processed polymer OLEDs where at display edges regions having non-uniform thickness or being thicker than central regions can appear. As regions of uniform thickness are preferred for displays only the uniform regions are emitting light (luminescent area) during operation, whereas the regions of non-uniform thickness are not illuminated (non-luminescent area).

There are devices using dummy cathode rows in the display that have extended the anode columns, leaving the active column electrode (in the luminescent area) attached to the dummy electrode (in the non-luminescent area). The anode columns both of the active and the non-active area usually provide electrical contact to the display, whereas the cathode rows of the non-active area are not electrically connected (dummy cathode rows). Thus, pixel elements being formed at the intersection of anode columns and dummy cathode rows are not illuminated.

The design described can cause potential electrical shorts to be transferred from the non-luminescent area to the luminescent area. This can happen when a pixel element in the non-luminescent area is defective and therefore causes a cathode row to reach a potential. As the anode columns crossing this specific cathode row have electrical contact, the voltage can be sufficient for a current to flow and light up pixels on the specific cathode row.

There is thus a need to prevent electrical cross talk through defects from non-luminescent area to luminescent area, so that there is no visible defect.

SUMMARY

Embodiments of the present invention are directed to, for example, minimizing the influence of a defective element on an electroluminescent device.

In a first embodiment, the device is an organic electroluminescent device comprising a first electrode region, wherein the first electrode region comprises a first active electrode region, a first dummy electrode region, said first dummy electrode region being electrically isolated from the first active electrode region. This has the advantage that the non-luminescent area of the device can be prevented from being illuminated not only by a second dummy electrode region, which can correspond to a dummy cathode region, but also by the first dummy electrode region, which can correspond to a dummy anode region. The first dummy electrode region can be a solid region of first electrode material. Advantageously, the first dummy electrode region then does not have to be patterned.

Preferably, the first active electrode region is within an active (luminescent) area of the device, which allows light emission out of the device, whereas the first dummy electrode region is within a non-active (non-luminescent) area of the device, which prevents light emission out of the device.

Within the scope of this disclosure, the active (luminescent) area of the device is always meant to allow light emission out of the device, whereas the non-active (non-luminescent) area of the device prevents light emission out of the device.

The active area can be surrounded by the non-active area. As material coating problems can exist with solution processed polymer OLEDs where at device edges, areas having non-uniform thickness or being thicker than central areas can appear, the active area preferably corresponds to a central area of the device, whereas the non-active area can correspond to an edge area of the device.

Most preferably, the first active electrode region is an active anode region and the first dummy electrode region is a dummy anode region.

In a further embodiment the first active electrode region is formed from a plurality of electrode stripes. Preferably, the electrode stripes are parallel to each other. Most preferably, the first electrode stripes comprise first active electrode stripes in the first active electrode region and first dummy electrode stripes in the first dummy electrode region. The first active electrode stripes can be disconnected from the first dummy electrode stripes.

Particularly, the first active electrode stripes and the first dummy electrode stripes can be separated by a gap which is free of first electrode material. The gap size should be chosen on the basis of OLED material conductivity and the photolithography definition capabilities available. A gap of sufficient size should be designed such that the first active and dummy regions remain electrically isolated, preventing connections through unetched electrode material, for example anode material, and defects, and connections through OLED material conductivity/cross-talk. Particularly, the gap between the first active electrode region and the first dummy electrode region can be in the range of micrometers, e.g. bigger than 10 µm.

In another embodiment, the device, which can be a display, further comprises a second electrode region comprising a second active electrode region and a second dummy electrode region. The second active electrode region may have electrical contact, whereas the second dummy electrode region may not. Furthermore, the second active electrode region may be electrically connected to a potential different from zero, especially smaller than zero, whereas the second dummy electrode region may be at a potential equal to zero. The first dummy electrode region and the second dummy electrode region could be addressed using separate drive scheme, or could form part of display icons or a sub-display area.

Preferably, the second active electrode region is within the active area of the device, which allows light emission out of the device, whereas the second dummy electrode region is within the non-active area of the device, which prevents light emission out of the device.

Most preferably, the second active electrode region is an active cathode region and the second dummy electrode region is a dummy cathode region.

In yet another embodiment, the second electrode region is formed from a plurality of second electrode stripes. Particularly, the second electrode stripes can be parallel. Furthermore, the second electrode stripes can cross the first electrode stripes, so that for example columns and rows with intersections might be formed. Thus, pixel elements are formed at the intersection of the first electrode stripes and the second electrode stripes.

In still another embodiment the second electrode material (either in combination with or independently of the first dummy electrode columns) could be segmented. Particularly, the second electrode stripes can be electrically disconnected to obtain second active electrode stripes and second dummy electrode stripes.

Preferably, the first dummy electrode region and the second dummy electrode region overlap. The first dummy electrode region and the overlapping second dummy electrode region are within the non-luminescent area of the device, whereas the first active electrode region and the overlapping second active electrode region are within the active or luminescent area of the device. The active region is addressed (either as an active matrix or passive matrix accordingly) and forms the viewable emissive display area.

In a preferred embodiment, the device comprises a substrate, the first electrode region arranged on the substrate, an organic stack arranged on the first electrode region, and the second electrode region arranged on the organic stack.

As used within the specification and the claims, the term "on" includes when layers are in physical contact and when layers are separated by one or more intervening layers.

The substrate can contain any or may be selected from the following materials: glass, quartz, silicon, plastic. Preferably, the substrate contains a transparent or translucent material. This has the advantage that light produced by an active electroluminescent layer of the organic stack can be emitted by passing the substrate.

The first electrode region can be a conductive layer which serves as a hole-injecting layer. Preferably, the first electrode region is selected from the following materials: platinum, gold, palladium, indium, tin oxide, ITO, graphite, silicon, germanium, gallium arsenide, polyaniline, polypyrrole, polythiophene. Most preferably, the first active electrode region is transparent or translucent for the light emitted from the active electroluminescent layer. This has the advantage that the light can be emitted out of the device by passing the first active electrode region.

The second electrode region can be a conductive layer which serves as an electron-injecting layer and which comprises a material with a low work function. Preferably, the second electrode region contains any of the following materials: aluminum, halides, e.g. lithium fluoride, cesium fluoride, magnesium fluoride, or combinations thereof. The second electrode region may be opaque for the light emitted from the active electroluminescent layer.

The organic stack preferably includes one or more layers, wherein at least one of the layers is an active electroluminescent layer. Most preferably the organic stack contains a polymer.

In the active electroluminescent layer electrons and holes recombine and light is emitted.

Furthermore, the organic stack can comprise a buffer layer, being an electrically conductive or semiconductor layer. The buffer layer advantageously can be used to improve the performance of the device, as cross talk or leakage current can be reduced thereby.

In a preferred embodiment, the buffer layer is patterned as electrically isolated conducting regions. Particularly, the electrically isolated conducting regions are formed at intersections of the first active electrode stripes and the second active electrode stripes. As pixel elements are formed at these intersections, the patterned buffer layer has the advantage that cross-talk between single pixel elements can be prevented.

The pixel elements comprise a portion of the first active electrode stripes, a portion of the second active electrode stripes, a portion of the organic stack being arranged between the first active electrode stripes and the second active electrode stripes, wherein the organic stack can include the buffer layer, and a portion of the substrate.

The electroluminescent device preferably is a display.

In a second embodiment according to the invention the organic electroluminescent device comprises a first electrode region, the first electrode region comprising a first active electrode region, a first dummy electrode region and a blocking layer extending on said first dummy electrode region preventing light emission from the non-active area of the device. Advantageously, in this embodiment the first active electrode region and the first dummy electrode region need not be separated from each other.

Particularly, the first dummy electrode region can be formed by arranging the blocking layer on a part of the first electrode region. In certain embodiments of the invention, the blocking layer on its own can prevent the light emission out of the device, thereby rendering this first electrode region with the blocking layer inactive. In other embodiments the blocking layer could be used in conjunction with the above described gaps separating the first active electrode region from the first electrode dummy region.

As mentioned above, also here the first active electrode region is preferably within the active area of the device, which allows light emission out of the device, whereas the first dummy electrode region is within the non-active area of the device, which prevents light emission out of the device.

Particularly, the second embodiment can include all features listed in connection with the first embodiment.

In a preferred embodiment the blocking layer is opaque for the light produced in the non-active area of the device. So, even if light is produced in the non-active area, this area cannot light up, as the opaque blocking layer blocks the light.

In another embodiment the blocking layer can block or at least reduce carrier injection into the active electroluminescent layer. Thus, production of light can be reduced.

In yet another embodiment the blocking layer is opaque and current-blocking. Thus, in addition to blocking light, production of light is reduced. In this case the blocking layer may contain a metal. Preferably the blocking layer contains any of the following materials: copper, chrome, aluminum or a combination thereof. This can reduce injection of holes into the active electroluminescent layer. Particularly, the opaque blocking layer can comprise a first layer of copper and a second layer of chrome. The first layer can have a thickness of a few hundred nanometers, e.g. 400 nm, whereas the second layer can have a thickness in the two digit nanometer range, e.g. 10 nm-20 nm.

Alternatively, the blocking layer can be electrically insulating. The electrically insulating blocking layer blocks current flow, and therefore no or almost no light is produced in the non-active area where the electrically insulating layer is. Preferably, the blocking layer contains a photo resist material or an inorganic material, e.g. an oxide or nitride. Additionally, the electrically insulating blocking layer may also be opaque.

The blocking layer can be arranged on the first electrode region extending on the first dummy electrode region, being an intervening layer between the first dummy electrode region and the organic stack. Furthermore, the blocking layer can be patterned as stripes. The blocking layer stripes can be formed congruent to the first dummy electrode stripes.

Advantageously, the first electrode stripes need not be disconnected as the blocking layer prevents the non-luminescent area from lighting up.

The blocking layer preferably is arranged between the organic stack and the first electrode region. Alternatively, the blocking layer could be arranged between the organic stack and the second electrode region.

A first embodiment of a method for producing an electroluminescent device comprises the following steps:
  providing a substrate,
  providing a first electrode layer on the substrate,
  producing at least one organic stack over the first electrode layer,
  producing a second electrode layer over the organic stack, the organic stack comprising at least one active electroluminescent layer, wherein providing the first electrode layer on the substrate comprises the method step of: patterning said first electrode layer to obtain a first electrode region comprising a first active electrode region and a first dummy electrode region. The first electrode region can be patterned as a plurality of first electrode stripes.

Preferably, providing the first electrode layer on the substrate comprises the method step of depositing the first electrode layer having a gap which is free of electrode material, the gap dividing said first electrode region in said first active electrode region and said first dummy electrode region. Advantageously, the first active electrode region can thus be electrically isolated from the first dummy electrode region. If the electrode region is patterned as a plurality of first electrode stripes, these stripes then comprise first active electrode stripes in the first active electrode region and first dummy electrode stripes in the first dummy electrode region. The second electrode region can also be patterned as a plurality of second electrode stripes.

An alternative method for producing an electroluminescent device comprises the steps of:
  providing a substrate
  providing a first electrode layer on the substrate,
  producing at least one organic stack over the first electrode layer,
  producing a second electrode layer over the organic stack, the organic stack comprising at least one active electroluminescent layer, wherein providing the first electrode layer on the substrate comprises the method step of depositing a first electrode layer on the substrate and providing a blocking layer on the first electrode layer to obtain a first active electrode region and a first dummy electrode region, the blocking layer extending on the first dummy electrode region. Also here, the first electrode region comprising the first active electrode region and the first dummy electrode region can be patterned as a plurality of first electrode stripes. Thus, light production or emission can be prevented in the non-active of the display.

For example, the first electrode layer can be produced by depositing a first electrode layer and depositing a photo resist on the first electrode layer, e.g. by spin-coating, roller coating or spray coating. The patterning of the first electrode layer can be done by photolithography and etching. Preferably, the blocking layer is made of the photo resist used for patterning the first electrode layer. Advantageously, this way only one step is needed for patterning the first electrode layer and producing the blocking layer.

The organic stack can be produced by ink jet printing, flex printing, or screen printing.

The second electrode layer can be produced by a metal deposition technique, e.g. by chemical or physical vapor deposition.

In addition, the methods described can include all features listed in connection with the embodiments of the device and vice versa.

The OLED display/device described earlier can be used within displays in applications such as, for example, portable equipment, computer displays, information displays in vehicles, television monitors, telephones, printers, and illuminated signs.

BRIEF DESCRIPTION OF THE DRAWINGS

FIGS. 2a, 2b, 2c illustrate a passive matrix OLED display in accordance with a first embodiment of the invention.

FIGS. 3a, 3b, 3c illustrate a passive matrix OLED display in accordance with a second embodiment of the invention.

FIG. 4 illustrates a passive matrix OLED display in accordance with a third embodiment of the invention.

DETAILED DESCRIPTION

An embodiment of the present invention pertains to an electronic device such as an OLED display. The electronic device includes multiple organic optoelectronic devices, which can be divided into devices that are part of a non-active respectively non-luminescent area and devices that are part of an active respectively luminescent area. The non-active area can differ from the active area by different means.

Figure 1:
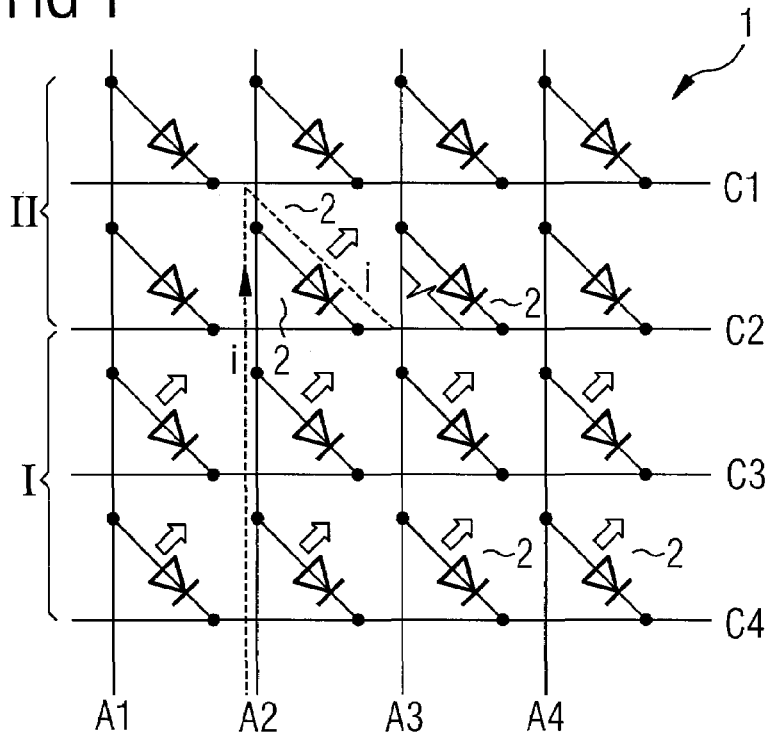
FIG. 1 illustrates a passive matrix OLED display.

It is explained in connection with FIG. 1 how a passive matrix OLED display can work. The display 1 comprises four first electrode columns, which are anode columns A1, A2, A3, A4, and four second electrode rows, which are cathode rows C1, C2, C3, C4. At intersections of the anode columns A1, A2, A3, A4 and the cathode rows C1, C2, C3, C4 pixel elements 2 are formed. The anode columns A1, A2, A3, A4 are connected to a positive potential P1 and the cathode rows C1, C2 are connected to a negative potential P2, so that the pixel elements 2 are illuminated in area I, which is thus the active or luminescent area. The cathode rows C3, C4 are not connected, so that the pixel elements 2 are not illuminated in area II, which is thus the non-active or non-luminescent area.

When the difference between the potential P1 applied to the anode columns A1, A2, A3, A4 and the potential P2 applied to the cathode rows C1, C2 is greater than an activation voltage, the pixel elements 2 are illuminated.

However, a defective pixel element 2 in area II can cause the cathode rows C2 to reach a potential P3. When the difference between the potential P1 applied to the anode columns A1, A2, A3, A4 and the potential P3 is greater than the activation voltage, a current i can flow lighting up pixel elements 2 within the non-active area II.

Figure 2A:
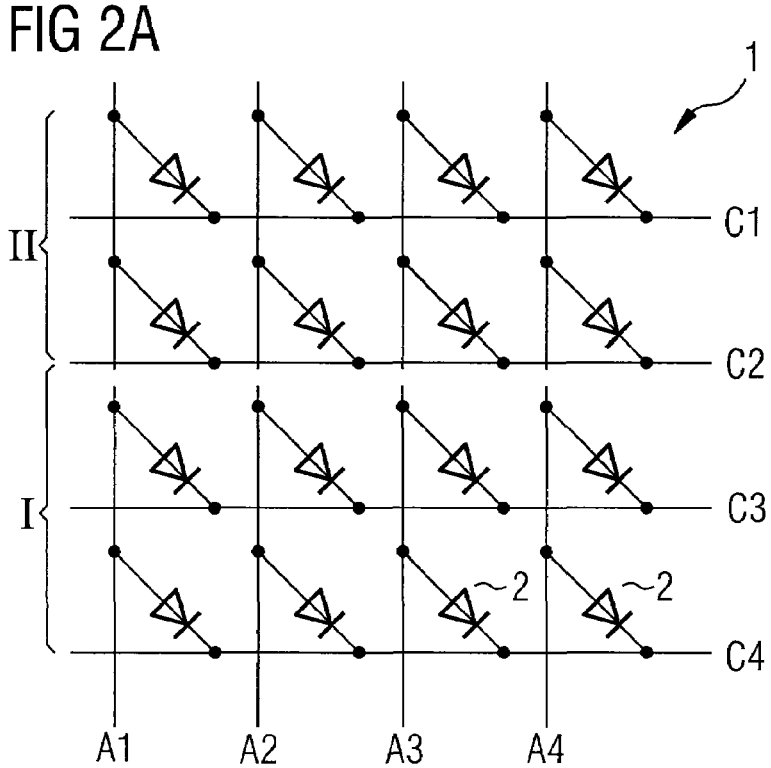

FIG. 2a shows a first embodiment of a display according to the present invention. The display 1 comprises four first electrode columns, which are anode columns A1, A2, A3, A4 and four second electrode rows, which are cathode rows C1, C2, C3, C4, where at intersections of the anode columns A1, A2, A3, A4 and the cathode rows C1, C2, C3, C4 pixel elements 2 are formed.

In this embodiment the anode columns A1, A2, A3, A4 are disconnected. Especially, the anode columns A1, A2, A3, A4 are disconnected at the change from the active area I to the non-active or dummy area II. Thus the anode columns A1, A2, A3, A4 comprise active anode columns (in area I) and dummy anode columns (in area II). Preferably, no electrical contact is provided to the anode columns A1, A2, A3, A4 in area II, whereas the anode columns A1, A2, A3, A4 in area I are connected. This has the advantage, that if pixel elements 2 in the dummy area II are defective, other pixel elements 2 do not light up anyway, as no electrical contact is provided to the anode columns A1, A2, A3, A4 in area II.

Furthermore, the cathode rows C1, C2 are preferably dummy cathode rows (without electrical contact).

FIG. 2b illustrates a plan view of the first embodiment. Both the anode columns A1, A2, A3, A4 and the cathode rows C1, C2, C3, C4 are patterned as stripes. The portion of anode columns A1, A2, A3, A4 in area I, the active anode columns, can be understood as an active anode region 4a, whereas the portion of anode columns A1, A2, A3, A4 in area II, the dummy anode columns, can be understood as a dummy anode region 4b. Correspondingly, the cathode rows C3, C4 can be understood as an active cathode region 6a, whereas the cathode rows C1, C2 can be understood as a dummy cathode region 6b.

The dummy anode region 4b and the dummy cathode region 6b are arranged the way that they overlap.

The anode columns A1, A2, A3, A4 are disconnected at the change from area I to area II, wherein a distance D between the disconnected anodes is big enough to ensure electrical isolation. Furthermore, the distance D can depend on the fabrication process, e.g. a photolithography process. The distance D can be in the range of micrometers, e.g. bigger than 10 μm. By the gap of missing anode material the active anode region 4a is electrically isolated from the dummy anode region 4b.

FIG. 2c illustrates a cross section of the display 1 shown in FIG. 2b along the line BB'. The display 1 comprises a substrate 3, which preferably contains glass. Advantageously, glass is transparent, so that radiation produced in an organic stack 5 can couple out via the substrate 3.

The anode regions 4a is arranged on the substrate 3. Preferably, the anode layer contains ITO, which can be sputtered on the substrate 3. An active anode region 4a and a dummy anode region 4b comprise the anode layer, region 4a and region 4b being patterned as four anode columns A1, A2, A3, A4 (see FIG. 2b), having a disconnection. This disconnection divides anode column A2 in two parts: an active anode column and a dummy anode column. The two parts are separated by the distance D.

The anode regions 4a and 4b are at least partly covered by the organic stack 5. The organic stack 5 can be patterned as multiple electrically isolated conducting regions. The organic stack 5 comprises at least an active electroluminescent layer and possibly a buffer layer, which can be deposited in a manner such that the deposited material is patterned.

The cathode regions 6a and 6b are arranged on the organic stack 5.

Figure 3A:
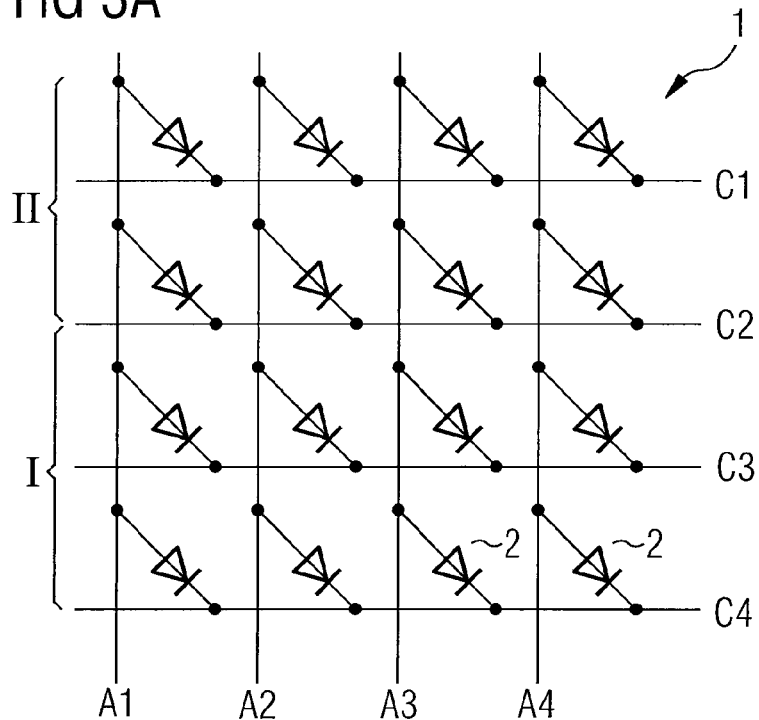
Figure 3B:
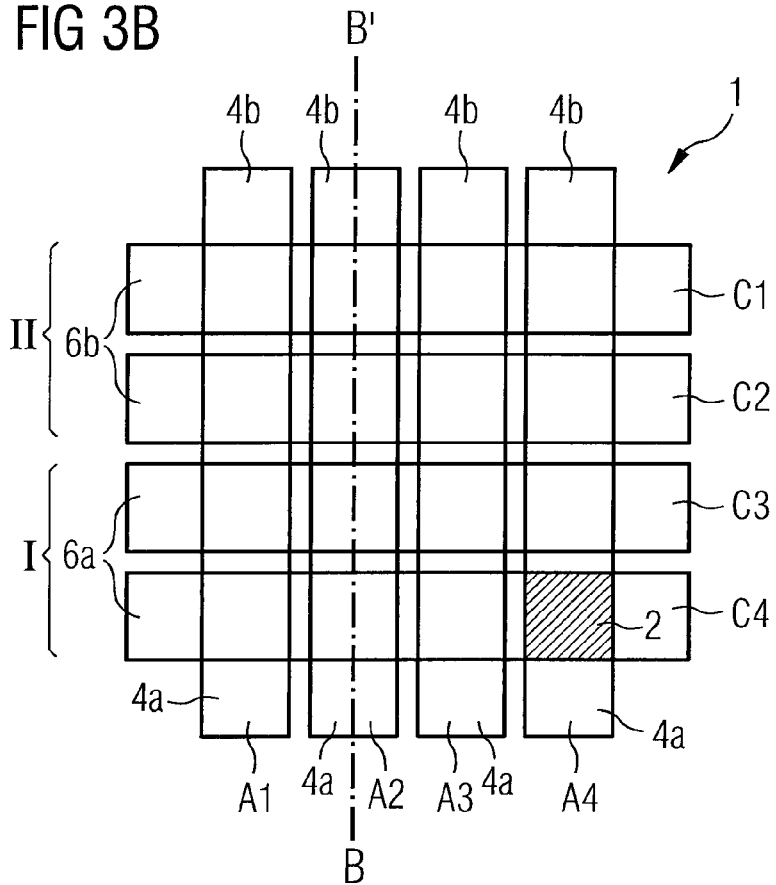

A second embodiment of a display is shown by FIG. 3a, FIG. 3b and FIG. 3c. As FIG. 3a and FIG. 3b illustrate, neither the first electrode columns, which are anode columns A1, A2, A3, A4 nor the second electrode rows, which are cathode rows C1, C2, C3, C4 are disconnected. Thus, as already described in connection with FIG. 1, pixel elements 2 in the dummy area II could easily be illuminated if one of the pixel elements 2 was defective.

According to the invention, the effect of being illuminated can advantageously be prevented by a blocking layer 7 shown in FIG. 3c. The blocking layer 7 is arranged on a part of the anode region, thus forming the dummy anode region 4b. The blocking layer 7 is arranged between the dummy anode region 4b and the organic stack 5.

The blocking layer 7 extends in the non-active area II. The blocking layer 7 can be patterned in the form of stripes only covering the dummy anode columns.

The blocking layer 7 can be a radiation-blocking layer and/or a current-blocking layer.

In the case of a radiation-blocking layer, the blocking layer 7 contains an opaque material preventing light emission in area II. This material can also be current-blocking, e.g. containing copper, chrome or a combination of copper and chrome.

Alternatively, the blocking layer 7 can be electrically insulating containing a photo resist material or an inorganic material, e.g. an oxide or nitride. Furthermore, it can be opaque.

The display 1 shown in FIG. 4 comprises electrode stripes, particularly first electrode stripes like anode columns A1, A2, A3, A4, A5, and second electrode stripes like cathode rows C1, C2, C3, C4, C5, C6. Every cathode row is arranged orthogonally with respect to an anode column. The pixel elements 2 are formed at the intersection of an anode column and a cathode row.

Both the anode columns A1, A2, A3, A4, A5 and the cathode rows C1, C2, C3, C4, C5, C6 are arranged on the substrate 3. As can be seen from FIG. 4, the electrode stripes are not as long as the substrate 3. An edge 8 of the substrate 3 is free of electrode stripes and organic material.

The non-active area II of the display 1 is adjacent to edge 8 and to the active area I. Furthermore, the non-active area II surrounds the active area I. Particularly, the non-active area II can form a continuous ring area around area I. It is also possible that in further embodiments of the invention the non-active area surrounds the active area without forming a continuous ring around the active area.

In this embodiment, the technical features described in connection with FIGS. 2a, 2b, 2c and FIGS. 3a, 3b, 3c could also be incorporated. As the active anode columns, which correspond to the portion of anode columns A2, A3, A4 within the active area I, need electrical contact, these active anode columns are preferably electrically contacted via the dummy anode columns so that the active anode columns are in electrical contact with the dummy anode columns at least on one side of the display 1. The dummy anode columns correspond to the portion of anode columns A2, A3, A4 within the non-active area II. Furthermore, anode columns A1 and A5 are also dummy electrode columns.

To prevent pixel elements 2 in area II from being illuminated anyway, the anode columns A1, A2, A3, A4, A5 can be segmented along line EE', whereas the cathode rows C1, C2, C3, C4, C5, C6 can be segmented along line FF'. Furthermore, an area marked by the dots can for example be covered by the blocking layer.

Figure 5A:
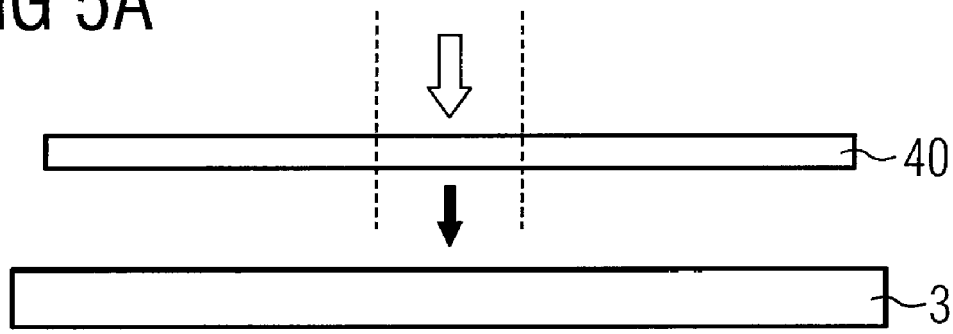
FIGS. 5a, 5b, 5c illustrate a method for producing an electroluminescent device in accordance with a first embodiment of the invention.

In FIG. 5a first steps of a method according to the invention are illustrated, which include providing a substrate 3 and depositing (dark arrow) a first electrode layer 40 on the substrate 3. After depositing, the first electrode layer 40 can be patterned (bright arrow), e.g. by photolithography and etching. The first electrode layer 40 is patterned to obtain a first active electrode region 4a (see FIG. 5b) and a first dummy electrode region 4b (see FIG. 5b). Alternatively, the first electrode layer 40 can be deposited on the substrate 3 as a structured layer already including the patterned regions 4a and 4b.

The regions 4a and 4b are electrically isolated by a gap D of missing first electrode material. Preferably, the regions 4a and 4b are formed by a plurality of electrode stripes. Most preferably, the regions 4a and 4b are anode regions containing any of the above mentioned materials.

Figure 5B:
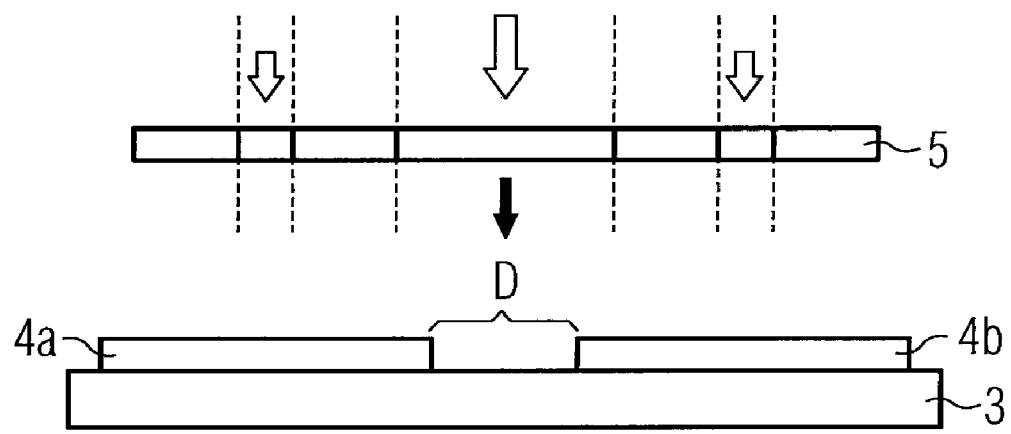

The organic stack 5 is provided on the regions 4a and 4b, as illustrated in FIG. 5b. If the organic stack 5 is patterned, it can be first deposited as a continuous layer and then be patterned or can already be deposited as patterned layer. The means applied for patterning are illustrated by the bright arrow. For example, the active electroluminescent layer (not shown) of the organic stack 5 can be patterned as stripes, whereas the buffer layer (not shown) of the organic stack 5 can be patterned as pixel elements.

Figure 5C:
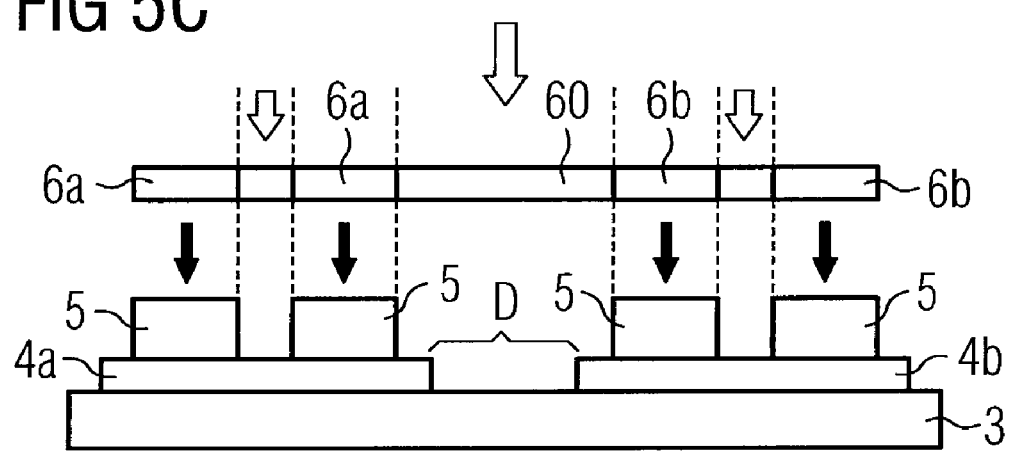

In FIG. 5c the deposition of a second electrode layer 60 on the organic stack 5 is illustrated. The second electrode layer 60 is patterned (bright arrow) as a second active electrode region 6a and a second dummy electrode region 6b. The patterning can be done by removing second electrode material from the deposited second electrode layer 60 or by depositing the second electrode layer 60 as patterned regions 6a and 6b. Preferably, the regions 6a and 6b are formed from a plurality of electrode stripes.

Figure 6A:
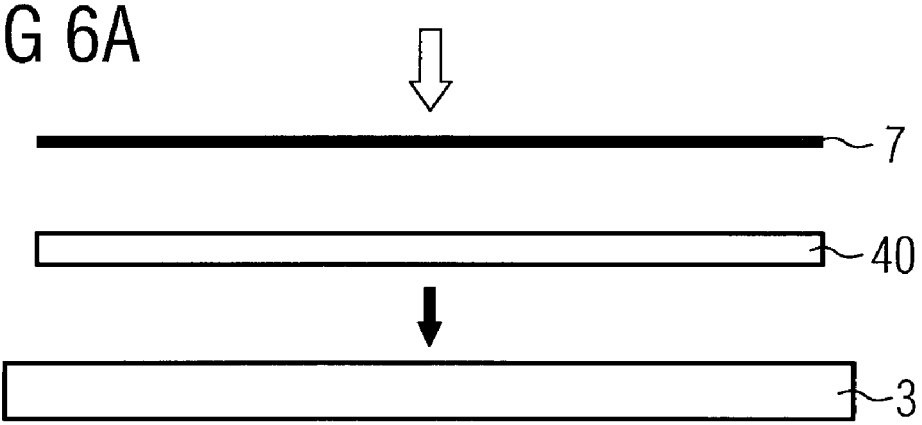
FIGS. 6a, 6b, 6c illustrate a method for producing an electroluminescent device in accordance with a second embodiment of the invention.
Figure 6B:
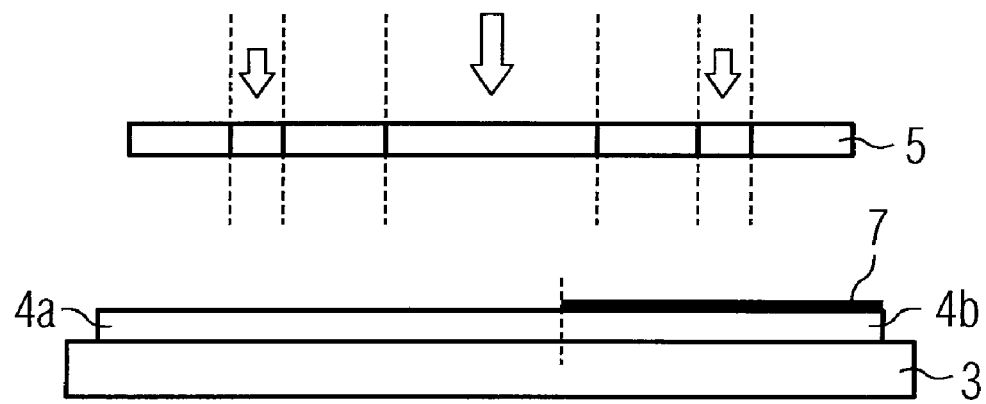
Figure 6C:
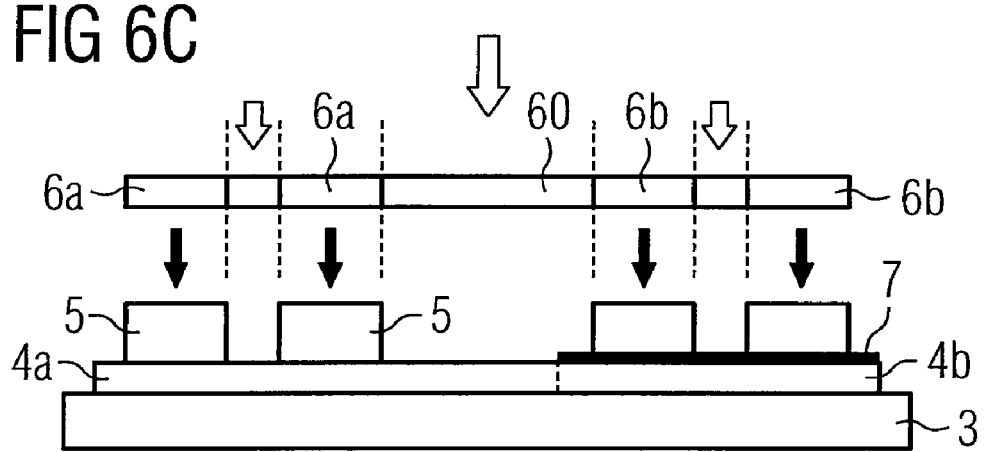

A second embodiment of a method according to the invention is shown in FIGS. 6a, 6b, 6c, wherein a first dummy electrode region is formed by overlaying a part of the first electrode layer 40 by a blocking layer 7. The blocking layer 7 may be formed by not removing a part of a photo resist. The photo resist can be deposited on the first electrode layer 40 in order to pattern the first electrode layer 40. Preferably, the photo resist is light blocking and/or electrically isolating.

The deposition of the organic stack 5 (FIG. 6b) and the second electrode layer 60 (FIG. 6c) can done in the same way as already described in connection with FIG. 5b and FIG. 5c.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

What is claimed is:

1. An organic electroluminescent device, comprising:
    a first electrode region, comprising:
        a first active electrode region;
        a first dummy electrode region; and
        a blocking layer extending on said first dummy electrode region preventing light emission from a non-active area of the device, wherein said non-active area stretches over a continuous zone comprising at least two pixel elements of the device.

2. A device according to claim 1, wherein:
    the first active electrode region is within an active area of the device, which allows light emission out of the device; and
    the first dummy electrode region is within the non-active area of the device, which prevents light emission out of the device.

3. A device according to claim 2, wherein the active area is surrounded by the non-active area.

4. The device of claim 3, wherein:
    the first active electrode region and the first dummy electrode region are arranged on a substrate, an edge area of the substrate being free of the first active electrode region and the first dummy electrode region; and
    the first dummy electrode region is located between the edge area of the substrate and the first active electrode region.

5. A device according to claim 2, wherein:
    the active area is surrounded by the non-active area; and
    the non-active area forms an edge area of the device.

6. A device according to claim 1, wherein:
    the first active electrode region is an active anode region; and
    the first dummy electrode region is a dummy anode region.

7. A device according to claim 1, wherein the blocking layer is opaque to the light produced in the non-active area of the device.

8. A device according to claim 1, wherein the blocking layer blocks carrier injection into an electroluminescent layer of the at least two pixel elements.

9. A device according to claim 8, wherein the blocking layer contains a metal.

10. A device according to claim 9, wherein the blocking layer contains a material selected from a group consisting of copper and chromium.

11. A device according to claim 1, wherein the blocking layer is electrically insulating.

12. A device according to claim 11, wherein the blocking layer contains a photo resist material or an inorganic material.

13. A device according to claim 12, wherein the inorganic material is an oxide or a nitride.

14. A device according to claim 1, wherein said first electrode region is formed from a plurality of first electrode stripes.

15. A device according to claim 1, further comprising a second electrode region, comprising:
    a second active electrode region; and
    a second dummy electrode region.

16. A device according to claim 15, wherein:
    the second active electrode region is within an active area of the device, which allows light emission out of the device; and
    the second dummy electrode region is within the non-active area of the device, which prevents light emission out of the device.

17. A device according to claim 15, wherein:
    the second active electrode region is an active cathode region; and
    the second dummy electrode region is a dummy cathode region.

18. A device according to claim 15, wherein said second electrode region is formed from a plurality of second electrode stripes.

19. A device according to claim 15, wherein said first dummy electrode region and said second dummy electrode region overlap.

20. A device according to claim 15, further comprising:
    a substrate, the first electrode region arranged on the substrate; and
    an organic stack arranged on the first electrode region and the second electrode region arranged on the organic stack.

21. A device according to claim 20, wherein the blocking layer is arranged between the organic stack and the first electrode region.

22. A device according to claim 20, wherein the substrate contains any of the following materials: glass, quartz, silicon or plastic.

23. A device according to claim 20, the organic stack comprising a buffer layer, wherein the buffer layer is patterned as electrically isolated conducting regions.

24. A device according to claim 23, wherein the electrically isolated conducting regions are formed at intersections of first electrode stripes and second electrode stripes.

25. A device according to claim 15, wherein the second electrode region is selected from the following materials: aluminum, silver, magnesium, calcium, barium, halide, lithium fluoride, cesium fluoride, magnesium fluoride, or combinations thereof.

26. A device according to claim 1, wherein the first electrode region is selected from the following materials: platinum, gold, palladium, indium, tin oxide, ITO, graphite, silicon, germanium, gallium arsenide, polyaniline, polypyrrole or polythiophene.

27. A device according to claim 1, which is a display.

* * * * *